(12) United States Patent
Pruss et al.

(10) Patent No.: US 7,699,537 B2
(45) Date of Patent: Apr. 20, 2010

(54) OPTICAL PORT APPARATUS AND METHOD OF MAKING THE SAME

(75) Inventors: Robin Harvey Pruss, Streamwood, IL (US); Mark Thomas Scheitler, Chicago, IL (US); Carey Allen Nazarian, Northfield, IL (US); Rita Robin Walters, Crystal Lake, IL (US); Michael P. Radochonski, Palatine, IL (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 845 days.

(21) Appl. No.: 11/588,478

(22) Filed: Oct. 27, 2006

(65) Prior Publication Data
US 2008/0165516 A1    Jul. 10, 2008

(51) Int. Cl.
  *G02B 6/00* (2006.01)
  *G02B 6/36* (2006.01)
  *B29C 65/00* (2006.01)
  *C03C 27/00* (2006.01)
  *H01L 21/00* (2006.01)
  *H01L 31/0232* (2006.01)

(52) U.S. Cl. .............. 385/94; 385/88; 385/92; 156/99; 156/106; 156/108; 438/64; 438/65; 438/69

(58) Field of Classification Search .......... 156/106
See application file for complete search history.

(56) References Cited

U.S. PATENT DOCUMENTS

| 4,403,243 | A | * | 9/1983 | Hakamada | ............. 257/772 |
| 4,853,055 | A | * | 8/1989 | Taylor | ............. 156/108 |
| 4,933,227 | A | * | 6/1990 | Stewart | ............. 427/192 |
| 6,123,464 | A | * | 9/2000 | Murata et al. | ............. 385/92 |
| 6,188,814 | B1 | * | 2/2001 | Bhalla | ............. 385/15 |
| 6,499,439 | B1 | * | 12/2002 | Kohler et al. | ............. 122/19.2 |
| 2005/0104406 | A1 | * | 5/2005 | Pennerath | ............. 296/93 |

\* cited by examiner

*Primary Examiner*—Michelle R Connelly Cushwa
(74) *Attorney, Agent, or Firm*—Tarolli, Sundheim, Covell & Tummino LLP

(57) ABSTRACT

An optical port apparatus includes a housing having oppositely disposed first and second housing surfaces and a housing body extending therebetween. A housing aperture extends about a central axis of the housing body. A groove surrounds the housing aperture. The groove extends partially through the housing body and has a bottom groove surface spaced from the second housing surface by a groove side wall. A shelf is located between the groove and the housing aperture. A gasket is located in the groove adjacent the bottom groove surface. The gasket surrounds the housing aperture. A window is located across the housing aperture in contact with the shelf. An elastomeric adhesive is located in the groove between the groove side wall and at least one of the window and the gasket. A bezel is fastened to the second housing surface adjacent the groove.

23 Claims, 1 Drawing Sheet

OPTICAL PORT APPARATUS AND METHOD OF MAKING THE SAME

TECHNICAL FIELD

The present invention relates to optics, and more particularly, to an optical port apparatus and method of making the same.

BACKGROUND

It is often desirable to provide sensor systems with enclosures to protect the sensor systems from harsh environmental conditions. The enclosures typically require one or more optical ports to allow one or more sensor systems access to the surrounding environment. An optical port is often made from a less durable material than the enclosures and, accordingly, may be particularly susceptible to structural damage and/or leakage from environmental conditions. The optical structures of the optical port may be sensitive to physical stresses arising from interaction with the mounting and/or sealing structures of the optical port. In addition, installation of the optical port necessitates placement of a hole in the enclosure, and an improperly sealed hole may allow passage of dust, debris, gasses, chemicals, water or other liquid vapors, and other unwanted contaminants between the outside and the inside of the enclosure. Furthermore, the structure of the optical port may allow unwanted transmission or receipt of electromagnetic interference (EMI) from an otherwise EMI-protected enclosure.

One example of a sensor system that requires protection from environmental conditions is a sensor system and enclosure that is mounted to an aircraft. An aircraft is exposed to a wide variety of stressful environmental conditions, such as extremely high or low temperatures and air pressures, extended periods of vibration, high-pressure water contact from pressure washing or rainstorms aloft, chemical vapors from fuel or other environmental factors, elevated levels of EMI, and the like. Any of these environmental stressors, singly or in combination, may be found in a typical operating cycle of an aircraft. Aircraft generally go through thousands of such cycles in a lifetime of service. It is very important for an optical port to resist such environmental conditions and maintain structural integrity of the enclosures, optical ports, and sensor systems. It is equally important for optical ports mounted to ground vehicles to resist harsh environmental conditions.

SUMMARY

The present invention relates to an optical port apparatus and method of making the same. One aspect of the present invention provides an optical port apparatus. The apparatus includes a housing having oppositely disposed first and second housing surfaces and a housing body extending therebetween. A housing aperture extends about a central axis of the housing body. A groove surrounds the housing aperture. The groove extends partially through the housing body and has a bottom groove surface spaced from the second housing surface by a groove side wall. A shelf is located between the groove and the housing aperture. A gasket is located in the groove adjacent the bottom groove surface. The gasket surrounds the housing aperture. A window is located across the housing aperture in contact with the shelf. An elastomeric adhesive is located in the groove between the groove side wall and at least one of the window and the gasket. A bezel is fastened to the second housing surface adjacent the groove.

Another aspect of the present invention provides a method of providing an optical port. A housing having oppositely disposed first and second housing surfaces and a housing body extending therebetween is provided. A housing aperture extends about a central axis of the housing body. A groove surrounds the housing aperture. The groove extends partially through the housing body and has a bottom groove surface longitudinally spaced from the second housing surface by a groove side wall. A shelf is located laterally between the groove and the housing aperture. A gasket is placed in the groove adjacent the bottom groove surface such that the gasket surrounds the housing aperture. A window is placed across the housing aperture. An elastomeric adhesive is dispensed into the groove between the groove side wall and the window and the gasket. The elastomeric adhesive substantially attaches the window to the housing. A bezel is fastened to the second housing surface adjacent the groove.

Yet another aspect of the present invention provides an optical port apparatus. The optical port apparatus includes a housing having oppositely disposed first and second housing surfaces and a housing body extending therebetween. A housing aperture extends about a central axis of the housing body. A groove surrounds the housing aperture. The groove extends partially through the housing body and has a bottom groove surface spaced from the second housing surface by a groove side wall. A shelf is located between the groove and the housing aperture. A gasket is located in the groove adjacent the bottom groove surface. The gasket surrounds the housing aperture. A window is located across the housing aperture in contact with the shelf. An elastomeric adhesive is located in the groove between the groove side wall and at least one of the window and the gasket. A bezel is fastened to the second housing surface adjacent the groove. A skin coat is located both between the bezel and the window and between the bezel and the adhesive. The window and the shelf are conductive and are adapted to conduct electromagnetic interference to the housing from the window through the conductive shelf and substantially prevent transmission of electromagnetic interference between the first and second housing surfaces.

DETAILED DESCRIPTION

Figure 1:
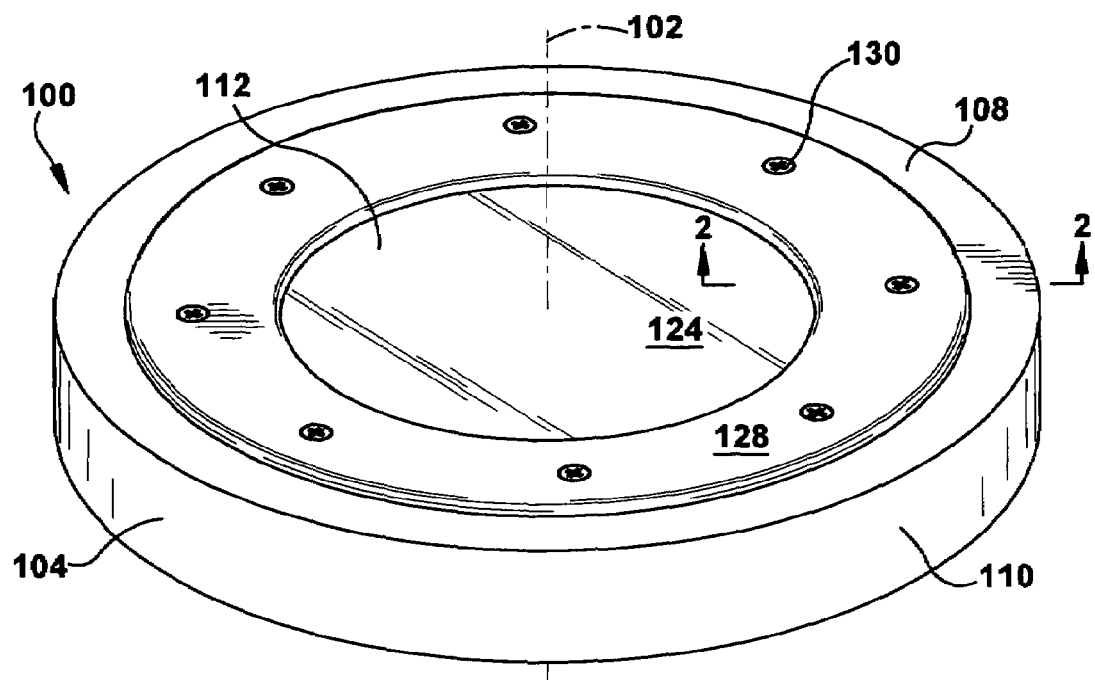
FIG. 1 depicts a perspective view of an optical port in accordance with an aspect of the present invention.
Figure 2:
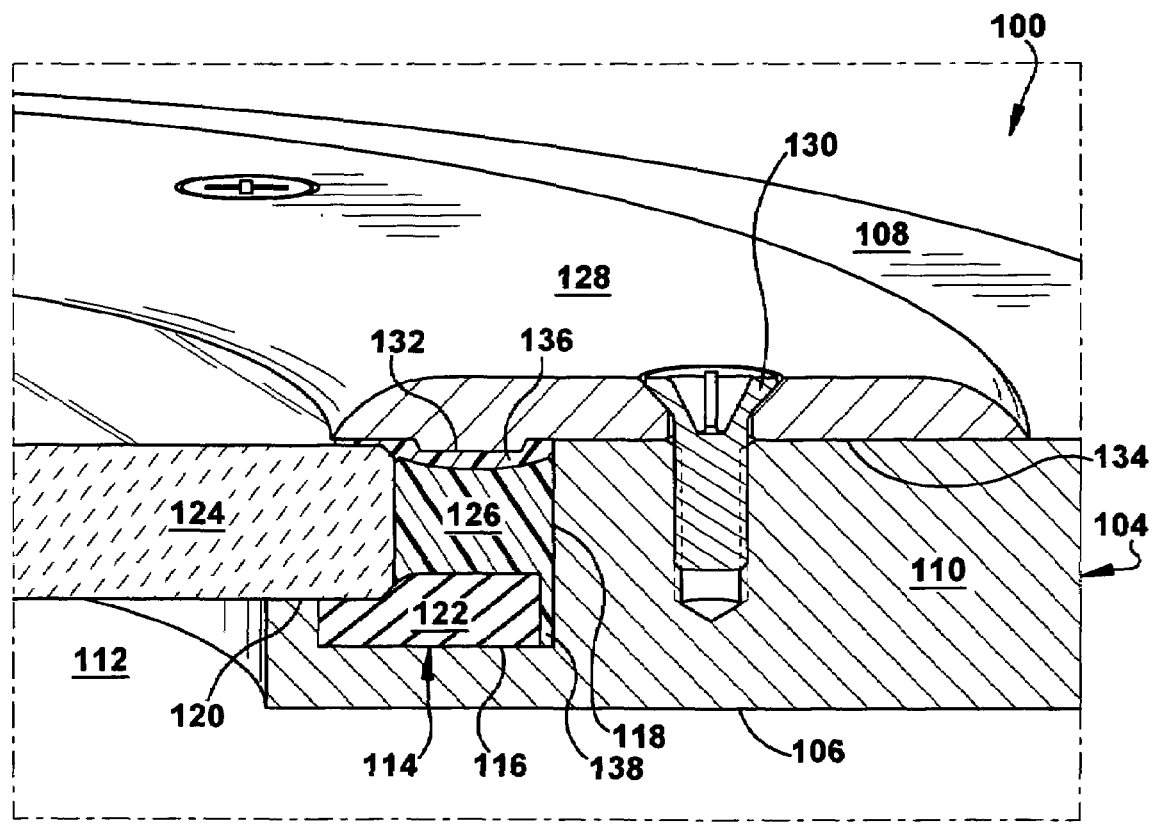
FIG. 2 depicts a cross-sectional view taken along the line 2-2 of FIG. 1.

FIG. 1 depicts an optical port 100 having a central axis 102. FIG. 2 is a cross-sectional view of the optical port 100 taken along the line 2-2 of FIG. 1. The optical port 100 includes a housing 104 having oppositely disposed first and second housing surfaces 106 and 108, respectively, and a housing body 110 extending between the first and second housing surfaces. A housing aperture 112 extends about the central axis 102 of the housing body. Optionally, and as shown in FIG. 1, the housing aperture 112 may be generally circular when viewed in plan view. Otherwise, the housing aperture 112 may be of any shape as desired for a particular application of the present invention. The housing 104 may be freestanding, as depicted in FIG. 1, or may be a portion of a larger structure, such as an enclosure (not shown) that can mount to a vehicle, a building, a stand, an airplane, or other mountable structure. The housing 104 may be made of any suitable material, though is preferably at least partially made from an electrically conductive material such as, but not limited to, a metal such as Aluminum Alloy 6061-T6.

As can be seen in FIG. 2, the housing 104 includes a groove 114 surrounding the housing aperture 112. The groove 114 extends partially through the housing body 110. The groove 114 has a bottom groove surface 116 spaced from the second housing surface 108 by a groove side wall 118. The housing 104 also includes a shelf 120, located between the groove 114 and the housing aperture 112. The shelf 120 may be conductive. To enhance conductivity, the shelf 120 may be at least partially coated with a conductive material (not shown), such as Chemical Conversion Coated Class 3. At least a portion of the shelf 120 may be either flush with (not shown) or offset from (as shown in FIG. 2) the bottom groove surface 116.

A gasket 122 is located in the groove 114, adjacent the bottom groove surface 116. The gasket 122 surrounds the housing aperture 112. The gasket 122 may be made at least partially from a material having low outgassing and moisture permeability properties, such as, but not limited to, butyl rubber, 40 Durometer Shore A. The gasket 122 may serve to help prevent moisture and other unwanted contaminants from traveling between the first and second housing surfaces 106 and 108 of the assembled optical port 100.

A window 124 is located across the housing aperture 112. The window may be opaque to visible light, but translucent or transparent to light outside the visible spectrum. That is, the window 124 may be configured to substantially block transmission of visible spectrum light while simultaneously permitting transmission of at least one of ultraviolet (UV), infrared (IR), or other non-visible spectrum light. Such a window 124 may be useful when a sensor system is configured to send or receive UV or IR light, but it is unnecessary or undesirable to send or receive light outside these spectrums. In order to provide such optical properties, the window 124 may be made from a material such as, but not limited to, optical grade silicon or sapphire. Optionally, the window 124 is at least partially made from and/or coated with an electrically conductive material. Alternatively, a conductive grid (not shown) can be formed on the window 124.

An elastomeric adhesive 126 is located in the groove 114 between the groove side wall 118 and at least one of the window 124 and the gasket 122. The adhesive 126 can substantially attach the window 124 to the housing 104. Any suitable adhesive 126, having any suitable curing method and/or time, may be used. One nonlimiting example of a suitable adhesive is sold by the General Electric Company of Fairfield, Conn. as RTV 566. The adhesive 126 may be provided in a liquid or semi-liquid state and allowed to harden and cure after placement in the groove 114. In addition to helping hold the window 124 to the housing 104, the adhesive 126 may serve to resiliently absorb and/or dissipate forces acting on the optical port 100 to alleviate physical stresses on the window 124.

A bezel 128 is fastened to the second housing surface 108 adjacent the groove 114. The bezel 128 may be made from any suitable material such as, but not limited to, Aluminum Alloy 6061-T6, Type III, Class 2 anodized. The bezel 128 may be fastened to the housing 104 using any suitable fastener 130 such as, but not limited to, screws (as shown), adhesives, staples, bolts, nails, rivets, welds, crimps, or the like. The bezel 128 may facilitate the retention of the window 124 in the housing aperture 112. Optionally, the bezel 128 is adapted to substantially protect the adhesive 126 from atmospheric conditions found adjacent the second housing surface 108, such as repeated erosive impacts of high-pressure water from rainstorms or power washing.

A locating portion 132 may protrude from an inner bezel surface 134 of the bezel 128. For example, the locating portion 132 could be a solid or interrupted ring or ridge protruding from the inner bezel surface 134 and matched in shape, size, or any other characteristic with the groove 114. When present, the locating portion 132 may be adapted to at least partially enter the groove 114 and thereby facilitate positioning of the bezel 128 substantially surrounding the housing aperture 112.

An adhesive skin coat 136 is optionally located between the bezel 128 and the window 124 and between the bezel 128 and the adhesive 126 and in contact with the wall 118. The skin coat 136 may be of any suitable type, such as, but not limited to, a skin coat sold by PRC-DeSoto of Glendale, Calif. as PR-1428, A-2. The skin coat 136, when present, may serve to protect other structures of the optical port 100, such as the adhesive 126, from degradation due to exposure to chemicals, moisture, or other unwanted contaminants.

To assemble the optical port 100, the housing 104, window 124, and other structures of the optical port 100 should be cleaned and an appropriate primer (not shown) applied, as appropriate. The optical port 100 may be assembled on a flat surface in a climate-controlled environment.

First, the gasket 122 is placed in the groove 114, surrounding the housing aperture 112. Preferably, the gasket 122 contacts the bottom groove surface 116 and is spaced apart from the groove side wall 118. Such spacing creates a tolerance gap 138 between the groove side wall 118 and the gasket 122 and ensures that the gasket 122 lies flat, without wrinkling, cupping, or bowing, along the bottom groove surface 116. In use, the tolerance gap 138, when present, provides room for relative thermal expansion and contraction of the various structures of the optical port 100 arising from differences in thermal sensitivity of the materials used in the optical port, and generally prevents physical stresses from acting fully on the window 124.

Next, the window 124 is placed across the housing aperture 112, with at least a portion of the window in contact with the shelf 120. When the window 124 and shelf 120 are both conductive, as described above, such contact facilitates the conduction of EMI between the window and shelf, and thus to the housing 104 for dispersal or grounding, for example to a chassis ground as desired. This arrangement may substantially prevent transmission of EMI between the first and outer portions of the optical port 100. The window 124 optionally overhangs the shelf 120 as shown in FIG. 2, extending beyond the shelf in a direction substantially perpendicular to the central axis 102. At least a portion of the gasket 122 may be compressed during assembly and use, as shown in FIG. 2, to ensure full electrical contact between the window 124 and the shelf 120.

Once the window 124 is positioned as desired, at least partially across the housing aperture 112, and the gasket 122 is optionally maintained in an adequately compressed condition by an applied mechanical force, the adhesive 126 may be dispensed into the groove 114 between the groove side wall 118 and at least one of the window 124 and the gasket 122, for example employing a syringe or other injection device. The adhesive 126 preferably flows into the tolerance gap 138, and an adequate amount of adhesive 126 should be provided to substantially fill the area of the groove 114 located between the window 124 and the groove side wall 118. The adhesive 126 may protrude from the groove 114 in substantially any direction. The adhesive 126 substantially attaches the window 124 to the housing 104. However, one of ordinary skill in the art could readily provide an additional fastening means (not shown) to attach the window 124 to the housing 104, as desired.

The adhesive 126 may be allowed to cure substantially completely before the mechanical compression force, when present, is removed from the gasket 122. As a result, the gasket 122 is maintained in a compressed condition, as shown in FIG. 2, during use and the electrically conductive relationship between the window 124 and the shelf 120 is maintained. Alternately, the gasket 122 may be shaped to facilitate electrical contact between the window 124 and the shelf 120 without being compressed.

Once the adhesive 126 has sufficiently cured, the bezel 128 may be positioned on the second housing surface 108 adjacent the groove 114. The locating portion 132, when present, may at least partially enter the groove 114 and be used to help position the bezel 128 as desired. The bezel 128 is then attached to the housing 104 with at least one fastener 130. Optionally, the bezel 128 helps retain the window 124 within the housing aperture 112.

When present, the skin coat 136 may be positioned adjacent at least one of the adhesive 126 and the window 124 before the bezel 128 is fastened to the housing 104. When the skin coat 136 is a curable liquid, the skin coat is dispensed on top of the adhesive 126 and the bezel 128 fastened to the housing 104 before the skin coat 136 has cured, thus causing any excess skin coat to ooze out from beneath the bezel 128, where such excess can be cleaned away from the adjacent window 124 or second housing surface 108 before curing. In such a manner, the skin coat 136 can help bond the inner bezel surface 134 to the window 124 and/or the second housing surface 108, while substantially preventing environmental chemicals or other unwanted contaminants from eroding the adhesive 126.

When assembled, the bezel 128, window 124, adhesive 126, gasket 122, and, when present, the skin coat 136 cooperatively substantially prevent passage of moisture, chemicals, or other contaminants between the first and second housing surfaces 106 and 108. Optionally, but not necessarily, a hermetic seal may be formed by the optical port 100, and one of ordinary skill in the art can readily choose the materials and configurations of the various structures of the optical port 100 to achieve a desired level of sealing. Additionally, the optical port 100 materials and configurations can be chosen to provide desired chemical resistance or other structural properties.

The present design minimizes stresses on the window 124 with the assistance of the tolerance gap 138 and/or any plastic or elastic compression or deformation of the various structures of the optical port 100. Stresses on the window 124 also can be avoided by plastic or elastic compression or deformation of the various structures of the optical port 100, as well. However, depending upon the sensitivity of the optical port 100 design to stresses on the window 124, one of ordinary skill in the art can readily design the window to position the optically significant portion away from the edges thereof.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An optical port apparatus, the apparatus comprising:
a housing having oppositely disposed first and second housing surfaces, a housing body extending therebetween, a housing aperture extending about a central axis of the housing body, a groove surrounding the housing aperture, the groove extending partially through the housing body and having a bottom groove surface spaced from the second housing surface by a groove side wall, and a shelf located between the groove and the housing aperture;
a gasket located in the groove adjacent the bottom groove surface, the gasket surrounding the housing aperture;
a window located across the housing aperture in contact with the shelf;
an elastomeric adhesive located in the groove between the groove side wall and at least one of the window and the gasket; and
a bezel fastened to the second housing surface adjacent the groove.

2. The optical port apparatus of claim 1, wherein the adhesive substantially attaches the window to the housing.

3. The optical port apparatus of claim 1, wherein the bezel facilitates the retention of the window across the housing aperture and is adapted to facilitate protection of the adhesive from atmospheric conditions.

4. The optical port apparatus of claim 1, further comprising a skin coat located both between the bezel and the window and between the bezel and the adhesive.

5. The optical port apparatus of claim 1, wherein the bezel, window, adhesive, and gasket cooperatively substantially prevent passage of liquid between the first and second housing surfaces.

6. The optical port apparatus of claim 1, wherein the window and shelf are conductive and cooperatively substantially prevent transmission of electromagnetic interference between the first and second housing surfaces.

7. The optical port apparatus of claim 1, wherein the window substantially blocks transmission of visible spectrum light while simultaneously permitting transmission of at least one of ultraviolet and infrared spectrum light.

8. The optical port apparatus of claim 1, wherein the bezel includes a locating portion on an inner bezel surface thereof, the locating portion being adapted to at least partially enter the groove.

9. The optical port apparatus of claim 1, wherein the window extends beyond the shelf in a direction substantially perpendicular to the central axis.

10. The optical port apparatus of claim 1, wherein the window is at least partially composed of one of optical grade silicon and sapphire.

11. The optical port apparatus of claim 1, wherein the housing is at least partially composed of anodized aluminum.

12. The optical port apparatus of claim 1, wherein the shelf is at least partially coated with a conductive material.

13. The optical port apparatus of claim 1, wherein the gasket is at least partially composed of butyl rubber.

14. A method of providing an optical port, the method comprising:
providing a housing having oppositely disposed first and second housing surfaces, a housing body extending therebetween, a housing aperture extending about a central axis of the housing body, a groove surrounding the housing aperture, the groove extending partially through the housing body and having a bottom groove surface longitudinally spaced from the second housing surface by a groove side wall, and a shelf located laterally between the groove and the housing aperture;

placing a gasket in the groove adjacent the bottom groove surface such that the gasket surrounds the housing aperture;

placing a window across the housing aperture;

dispensing an elastomeric adhesive into the groove between the groove side wall and the window and the gasket, the adhesive substantially attaching the window to the housing; and fastening a bezel to the second housing surface adjacent the groove.

15. The method of claim 14, wherein fastening a window across the housing aperture further comprises retaining the window in the housing aperture with assistance of the bezel, wherein the bezel substantially surrounds the housing aperture and is adapted to facilitate protection of the adhesive from atmospheric conditions.

16. The method of claim 14, further comprising providing a skin coat located both between the bezel and the window and between the bezel and the adhesive, the skin coat substantially preventing passage of liquid between the first and second housing surfaces with cooperation of the bezel, window, adhesive, and gasket.

17. The method of claim 14, wherein the window and shelf are conductive and cooperatively substantially prevent transmission of electromagnetic interference between the first and second housing surfaces.

18. The method of claim 14, wherein the window is configured to block transmission of visible spectrum light through the window while simultaneously permitting transmission of at least one of ultraviolet and infrared spectrum light through the window.

19. The method of claim 14, wherein the bezel includes a locating portion on an inner bezel surface thereof, and further comprising placing at least a portion of the locating portion into the groove.

20. The method of claim 14, wherein the shelf is conductive and is at least one of laterally flush with and offset from the bottom groove surface.

21. The method of claim 14, wherein the window is at least partially composed of optical grade silicon, the housing is at least partially composed of anodized aluminum, the shelf is at least partially coated with a conductive material and the gasket is at least partially composed of butyl rubber.

22. An optical port apparatus, the apparatus comprising:

a housing having oppositely disposed first and second housing surfaces, a housing body extending therebetween, a housing aperture extending about a central axis of the housing body, the housing aperture being generally circular, a groove surrounding the housing aperture, the groove extending partially through the housing body and having a bottom groove surface spaced from the second housing surface by a groove side wall, and a shelf located between the groove and the housing aperture;

a gasket located in the groove adjacent the bottom groove surface, the gasket surrounding the housing aperture;

a window located across the housing aperture in contact with the shelf;

an elastomeric adhesive located in the groove between the groove side wall and at least one of the window and the gasket;

a bezel fastened to the second housing surface adjacent the groove; and a skin coat located both between the bezel and the window and between the bezel and the adhesive; wherein the window and the shelf are conductive and are adapted to conduct electromagnetic interference to the housing from the window through the conductive shelf and substantially prevent transmission of electromagnetic interference between the first and second housing surfaces.

23. The method of claim 22, wherein the window is at least partially composed of optical grade silicon, the housing is at least partially composed of anodized aluminum, the shelf is at least partially coated with a conductive material and the gasket is at least partially composed of butyl rubber.

* * * * *